United States Patent [19]
Richardson et al.

[11] Patent Number: 5,689,215
[45] Date of Patent: Nov. 18, 1997

[54] METHOD OF AND APPARATUS FOR CONTROLLING REACTIVE IMPEDANCES OF A MATCHING NETWORK CONNECTED BETWEEN AN RF SOURCE AND AN RF PLASMA PROCESSOR

[75] Inventors: Brett Richardson, San Ramon; Tuan Ngo, Milpitas; Michael S. Barnes, San Francisco, all of Calif.

[73] Assignee: LAM Research Corporation, Fremont, Calif.

[21] Appl. No.: 652,037

[22] Filed: May 23, 1996

[51] Int. Cl.⁶ .................................................. H03H 7/40
[52] U.S. Cl. ........................................ 333/17.3; 364/482
[58] Field of Search .............................. 333/17.3; 364/482

[56] References Cited

U.S. PATENT DOCUMENTS

| | | | |
|---|---|---|---|
| 4,375,051 | 2/1983 | Theall | 333/17.3 |
| 4,629,940 | 12/1986 | Gagne et al. | 333/17.3 X |
| 4,965,607 | 10/1990 | Wilkins et al. | 333/17.3 X |
| 5,187,454 | 2/1993 | Collins et al. | 333/17.3 |
| 5,195,045 | 3/1993 | Keane et al. | 333/17.3 X |
| 5,225,847 | 7/1993 | Roberts et al. | 333/17.3 X |

*Primary Examiner*—Paul Gensler
*Attorney, Agent, or Firm*—Lowe, Price, LeBlanc & Becker

[57] ABSTRACT

An r.f. field is supplied by a reactive impedance element to a plasma in a vacuum plasma processing chamber. The element and source are connected via a matching network including first and second variable reactances that control loading of the source and tuning a load, including the reactive impedance element and the plasma, to the source. The values of the first and second variable reactances are changed to determine the amount the first variable reactance is to change for each unit change of the second variable reactance to attain the best match between the impedances seen looking into and out of output terminals of the r.f. source. Then the values of the first and second variable reactances are varied simultaneously based on the determination until the best impedance match between the impedances seen looking into and out of output terminals of the r.f. source is attained.

35 Claims, 4 Drawing Sheets

METHOD OF AND APPARATUS FOR CONTROLLING REACTIVE IMPEDANCES OF A MATCHING NETWORK CONNECTED BETWEEN AN RF SOURCE AND AN RF PLASMA PROCESSOR

BACKGROUND OF THE INVENTION

The present invention relates generally to a vacuum plasma processor method and apparatus and more particularly to such a method and apparatus wherein first and second variable reactances of an impedance matching network connected between an r.f. source and a load including the plasma and a reactive impedance element that excites the plasma are simultaneously varied along a trajectory determined by varying the first and second reactances until the best local match between the impedances seen looking into and out of output terminals of the source is attained.

BACKGROUND ART

Vacuum plasma processors are used to deposit materials on and etch materials from workpieces that are typically semiconductor, dielectric and metal substrates. A gas is introduced into a vacuum plasma processing chamber where the workpiece is located. The gas is ignited into a plasma in response to an r.f. electric or electromagnetic field. The r.f. field is provided by a reactive impedance element, usually either an electrode array or a coil which couples both magnetic and electrostatic r.f. fields to the gas. The reactive impedance element is connected to an r.f. source having an r.f. frequency and sufficient power such that the gas is ignited into the plasma. Connections between the source and the coil are usually by way of a relatively long coaxial cable, connected directly to the r.f. source, and a resonant matching network, connected between the cable and reactive impedance element. The matching network includes a pair of variable reactances, adjusted to match the impedance of the source to the load it is driving.

The load seen by the source is subject to substantial variations. The load has a relatively high impedance prior to ignition of the gas into a plasma state. In response to the plasma being ignited, the load impedance drops substantially due to the presence of the charge carriers, i.e., electrons and ions, in the excited plasma. The ignited plasma impedance also changes substantially due to variations in the plasma flux, i.e. the product of the plasma density and the plasma charge particle velocity. Hence, matching the source to the load to provide efficient transfer of power from the source to the load is somewhat difficult.

In the past, to maintain a matched impedance condition between the source and load both variable reactances have usually been simultaneously varied. Typically, the two reactance values are simultaneously varied until (1) no substantial phase difference is detected between the voltage and current supplied by the source to the cable and (2) the real impedance seen looking from the source into the cable is detected as substantially equaling the real impedance seen looking into the source output terminals.

It has been found that, in certain circumstances, this prior art approach is completely unsatisfactory because the reactances are varied in such a manner that matching is not approached. In other situations, a matched condition is achieved only after a considerable time has elapsed because the values of the reactances are simultaneously varied in a manner that does not result in consistently approaching the matched condition.

An attempt to resolve the problem is disclosed in the co-pending, commonly assigned application of Michael S. Barnes and John Patrick Holland Ser. No. 08/580,206, entitled APPARATUS FOR CONTROLLING MATCHING NETWORK OF A VACUUM PLASMA PROCESSOR AND MEMORY FOR SAME, filed Dec. 29, 1995. In this approach, the value of one reactance is varied while the value of the other reactance is maintained constant, until the best possible match is reached. Then, the value of the second reactance is varied while the value of the first reactance is maintained constant, until the best possible match is reached. The values of the reactances are repeatedly, sequentially varied in this manner until the best possible match is achieved. With this prior art approach the amount of time required to achieve a matched condition can be substantial as a result of the sequential variation of only one reactance at a time.

It is, accordingly, an object of the present invention to provide a new and improved method of and apparatus for controlling the values of variable reactances of an impedance matching network connected between an r.f. source and a load including a plasma of a plasma processor and a reactive impedance element for exciting the plasma.

Another object of the present invention is to provide a new and improved method of and apparatus for simultaneously varying the values of reactances of an impedance matching network connected between an r.f. source and a load including a plasma of a plasma processor and a reactive impedance element exciting the plasma wherein the time required to achieve the match condition is relatively short.

Another object of the invention is to provide a new and improved method of and apparatus for simultaneously controlling the variable reactances of an impedance matching network connected between an r.f. source and a load including a plasma and a reactive impedance element that excites the plasma, wherein the values of the reactances are varied in such a manner as to achieve matching along a trajectory that results in the match being approached rapidly since the correct direction of the trajectory is determined before the trajectory begins.

DISCLOSURE OF THE INVENTION

The invention concerns an r.f. plasma processor having a resonant matching network including first and second variable reactances that are varied in an improved manner and by an improved apparatus to control (a) loading of an r.f. excitation source and (b) tuning of a load including a plasma excitation reactive impedance element and the r.f. plasma to the source. According to one aspect of the invention, a determination is made of the amount the first variable reactance is to change for each unit change of the second variable reactance to attain the best match between the impedances seen looking into and out of output terminals of the r.f. source. This determination is made by changing the values of the first and second variable reactances according to established rules to attain the best "local" match. Then the values of the first and second variable reactances are varied based on this determination. The first and second reactances are varied until the best impedance match between the impedances seen looking into and out of output terminals of the r.f. source is attained. Preferably, the values of the first and second variable reactances are simultaneously varied as a result of the determination.

According to one aspect of the invention, the determination is performed by sequentially changing the values of the first and second variable reactances so the first variable reactance is changed while the second variable reactance is not changed and then the second variable reactance is changed while the first variable reactance is not changed. According to another aspect, the determination is performed by simultaneously changing the values of the first and second variable reactances.

In a preferred embodiment, the best match between the impedances seen looking into and out of output terminals of the r.f. source is determined as a function of the power coupled between the source and the load including the reactive impedance element and the plasma. In one embodiment, the function is maximum r.f. current flowing to the reactive impedance element. In another embodiment, the function is based on maximum power delivered to the load relative to source output power.

More specifically, the determination is initially made by: (1) changing the value of only the first of the variable reactances until the best local impedance match between the impedances seen looking into and out of output terminals of the r.f. source is attained, (2) then changing only the value of the second of the variable reactances until the best local impedance match between the impedances seen looking into and out of output terminals of the r.f. source is attained, (3) then changing the value of only the first of the variable reactances until the best local impedance match between the impedances seen looking into and out of output terminals of the r.f. source is attained. The determination is then made from indications of the values of the first and second variable reactances at the completion of steps (1) and (3). The determination results in a first straight line trajectory in a plot of the values of the first versus the second variable reactances.

As the first trajectory is being followed, a further determination is made as to whether the best possible impedance match meets a minimum criterion. In response to the minimum criterion being met, the values of the first and second variable reactances are maintained constant. If the minimum criterion is not met, the values of the first and second variable reactances are then again changed. In the preferred embodiment, the changed values are determined relative to an intermediate point along the first trajectory, but it is to be understood that the changed values can be at the end of the first trajectory (at the point on the first trajectory having the best impedance match). From the changed values at the intermediate point along or at the end of the first trajectory, a further trajectory is selectively computed in an attempt to reach the best match criterion. The further trajectory is selectively computed by establishing a second straight line trajectory at a right angle to the first trajectory. The second trajectory is followed by simultaneously varying the values of the first and second reactances until a new best possible local match between the impedances seen looking into and out of output terminals of the r.f. source is attained.

If the further trajectory is from the intermediate point along the first trajectory, the further trajectory is determined as a line between the intermediate point and the point for the new best possible local match. If the further trajectory is from the end of the first trajectory, then the values of the first and second variable reactances are simultaneously varied so there is a third straight line trajectory at a right angle to the second trajectory. The third trajectory is followed until the best possible match between the impedances seen looking into and out of output terminals of the r.f. source is attained. If the best match does not now reach the minimum criterion, the further trajectory is determined from the values of the first and second reactances at the end of the first and third trajectories. The further trajectory is then followed from the values of the first and second reactances at the end of the third trajectory.

Regardless of the way in which the further trajectory is determined, the further trajectory is followed until the best possible match between the impedances seen looking into and out of output terminals of the r.f. source is attained. Usually the best possible match at the end of the further trajectory results in at least 96% of the power derived from the source being delivered to the load. Alternatively, the further trajectory is established even if the minimum best match criterion is achieved at the end of the third trajectory.

Another aspect of the invention concerns a memory for use with a computer for controlling an r.f. field supplied to a plasma in a vacuum plasma chamber processing a workpiece. The r.f. field is supplied to the plasma by a reactive impedance element connected via a resonant matching network to an r.f. source. The r.f. field has a frequency and power level sufficient to ignite the gas into the plasma and to maintain the plasma. The matching network includes first and second variable reactances that control loading of the source and tuning a load including the reactive impedance element and the plasma to the source. The memory stores signals to cause the computer to: (1) determine the amount the first of the variable reactances is to change for each unit change of the second of the variable reactances to attain the best match between the impedances seen looking into and out of output terminals of the r.f. source by commanding the computer to vary the values of the first and second variable reactances, and (2) then vary the values of the first and second variable reactances based on the determination made in (1) until the computer determines the best impedance match between the impedances seen looking into and out of output terminals of the r.f. source is attained.

Accordingly, a further object of the invention is to provide a new and improved memory for controlling variable reactances of a vacuum plasma processor.

The above and still further objects, features and advantages of the present invention will become apparent upon consideration of the following detailed description of a specific embodiment thereof, especially when taken in conjunction with the accompanying drawings.

DESCRIPTION OF THE PREFERRED EMBODIMENT

Figure 1:
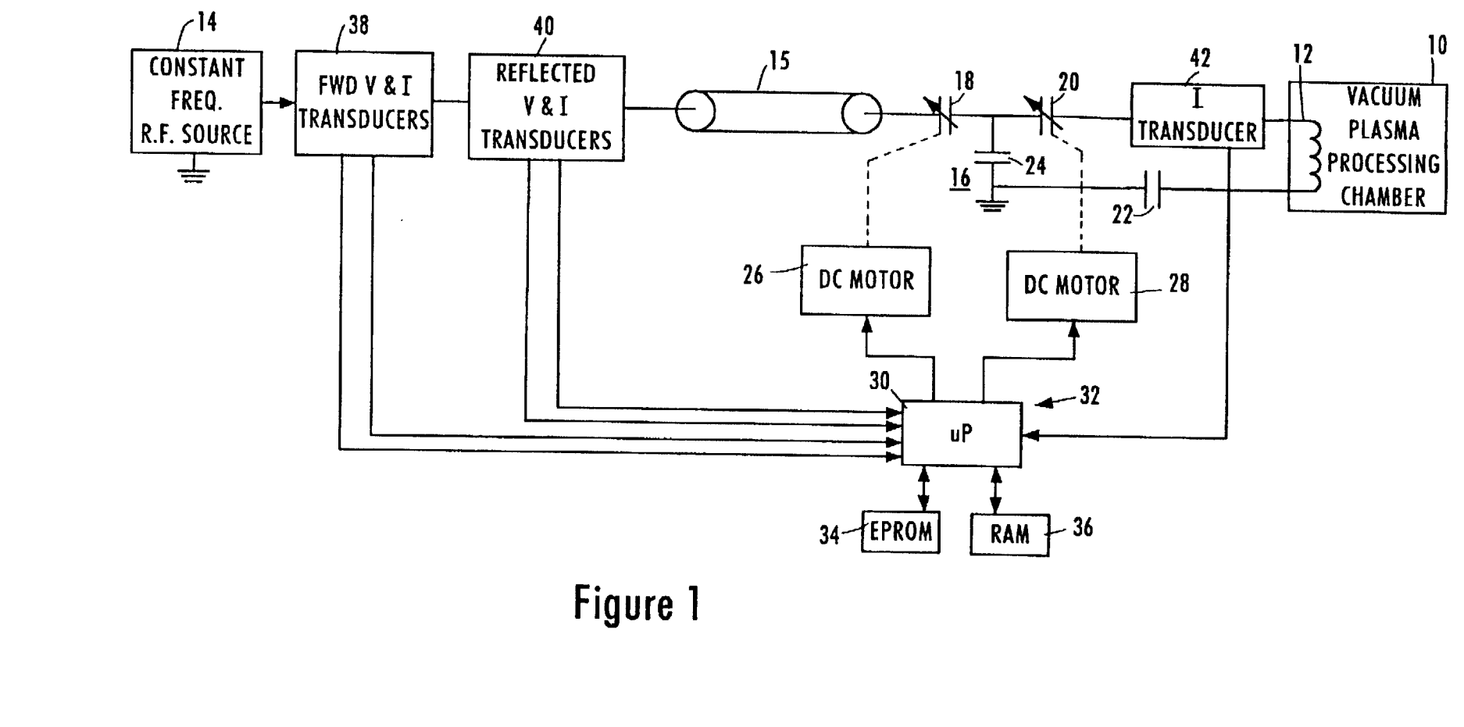
FIG. 1 is a combined block and schematic circuit diagram of a preferred embodiment of the invention.

Reference is now made to FIG. 1 of the drawing, wherein conventional vacuum plasma processing chamber 10 is illustrated as including excitation coil 12, connected to constant frequency (typically 13.56 MHz) r.f. source 14 by way of resonant matching network 16. Coil 12 is a reactive impedance element for deriving an r.f. electromagnetic field that is coupled from outside of chamber 10 through a dielectric window (not shown) of the chamber to the chamber interior. Vacuum plasma processing chamber 10 is supplied with a gas from a suitable source (not shown). The gas is excited to and maintained in a plasma state (i.e., as a plasma discharge) by the r.f. electromagnetic field derived from coil 12. A workpiece (not shown), typically a glass, semiconductor or metal substrate located in chamber 10 is processed by charge particles, i.e. electrons and ions, and neutral particles in the plasma so the workpiece is etched and/or material is deposited thereon. The plasma discharge and coil 12 form a load for source 14 and resonant matching network 16. Source 14 is connected to network 16 by cable 15, usually having a relatively long length, e.g. 13 feet. Cable 15 has a characteristic impedance at the frequency of source 14 equal to the output impedance of the source.

The plasma discharge in chamber 10 is subject to transient and nonlinear variations, which are reflected by matching network 16 and cable 15 to output terminals of r.f. source 14. Impedances of matching network 16 are controlled to minimize the power reflected back to the output terminals of source 14 despite these variations.

In a preferred embodiment, matching network 16 is configured as a "T," having two series arms, respectively including variable reactances in the form of series capacitors 18 and 20. The arm including capacitor 20 is in series with coil 12, in turn connected in series with fixed grounded capacitor 22. Matching network 16 also includes fixed shunt capacitor 24, connected between a common terminal for capacitors 18 and 20 and ground. Capacitor 18 primarily controls the magnitude of the resistive impedance component seen looking from the output terminals of source 14 into cable 15, while capacitor 20 primarily controls the magnitude of the reactive impedance seen looking from the output terminals of source 14 into cable 15. Frequently, capacitors 18 and 20 are respectively referred to in the art as the load and tune capacitors.

The values of capacitors 18 and 20 are usually varied so the output impedance of source 14, i.e. the impedance seen looking into the output terminals of source 14, usually 50 ohms resistive and zero ohms reactive ((50+j0)ohms), is matched to the impedance seen looking from the output terminals of the source into the input terminals of cable 15. The values of capacitors 18 and 20 are respectively varied by DC motors 26 and 28, supplied with DC control voltages by a digital to analog converter included in microprocessor 30 of microcomputer 32. Microcomputer 32 also includes EPROM 34 and RAM 36 that respectively store control program signals for the microprocessor and data signals that are manipulated by the microprocessor to control motors 26 and 28.

Microprocessor 30 includes an analog to digital converter responsive to signals from forward voltage and current transducers 38 and from reflected voltage and current transducers 40, as well as current transducer 42 that monitors the r.f. current flowing from matching network 16 to coil 12. Transducers 38 derive analog signals that are replicas of the r.f. voltage and current supplied by source 14 to cable 15. Transducers 40 derive analog signals that are replicas of the r.f. voltage and current reflected from cable 15 back to source 14. Each of transducers 38 and 40 includes a directional coupler, a current transformer for deriving the current replica and a capacitive voltage divider for deriving the voltage replica. Current transducer 42 includes a current transformer for deriving a signal that is a replica of the r.f. current flowing from matching network 16 to coil 12.

Microprocessor 30 responds to the analog signals derived from transducers 38, 40 and 42 to derive digital signals indicative of (1) the magnitude and relative phase angle of the r.f. voltages and currents supplied by source 14 to cable 15 and reflected from the cable to the source and (2) the r.f. current magnitude flowing from network 16 to coil 12. These digital signals are stored in RAM 36 and are manipulated by microprocessor 30 under the control of program signals stored in EPROM 34 to derive further signals that are used to derive control signals for motors 26 and 28.

In accordance with the present invention, the values of capacitors 18 and 20 are varied by motors 26 and 28 in response to signals derived from microprocessor 30 to supply sufficient power to coil 12 to maintain the gas in chamber 10 in an excited plasma state. The values of capacitors 18 and 20 are varied in a direction to maximize a function of power coupled from source 14 to coil 12. The function can be any of: (1) the ratio of delivered r.f. power to forward r.f. power, (2) percent delivered r.f. power, or (3) r.f. current supplied by matching network 16 to coil 12. When these functions are maximized, there is a substantial impedance match, at the frequency of source 14, between the source and the load it is driving; i.e., the impedance, at the source frequency, seen looking into the output terminals of source 14 is approximately equal to the impedance seen looking from the source into cable 15.

Microprocessor 30 determines forward r.f. power, i.e., the r.f. power supplied by source 14 to cable 15, and delivered power, i.e., the power actually supplied to coil 12 by matching network 16, in response to the output signals of transducers 38 and 40. To this end, microprocessor 30 determines r.f. forward power by multiplying signals representing the r.f. voltage and current outputs of transducer 38 in accordance with $$P_f = V_o I_o \cos \theta_o$$

where:

$V_o$ is the magnitude of the r.f. output voltage of source 14, $I_o$ is the magnitude of the r.f. output current of source 14, and $\theta_o$ is the phase angle between the voltage and current derived from source 14.

To determine delivered r.f. power, microprocessor 30 determines reflected r.f. power. Microprocessor 30 determines reflected r.f. power in response to the r.f. voltage and current outputs of in transducer 40 in accordance with $$P_r = V_r I_r \cos \theta_r$$

where:

$V_r$ is the magnitude of the r.f. voltage reflected from cable 15 to source 14, $I_r$ is the magnitude of the r.f. current reflected from cable 15 toward source 14, and $\theta_r$ is the phase angle between the reflected voltage and current.

Microprocessor 30 determines delivered r.f. power ($P_d$) as ($P_f - P_r$). Percent delivered r.f. power (% $P_d$) is similar to the ratio of r.f. delivered power to r.f. forward power but is calculated by microprocessor 30 as $$\frac{P_f - P_r}{P_f} \times 100.$$

When there is a match, there is no r.f. reflected power, so (a) $P_d = P_f$, (b) the ratio of delivered r.f. power to forward power $$\left(\frac{P_d}{P_f}\right)$$

is 1, and (c) % $P_d$=100. Microprocessor 30 determines the r.f. current ($I_c$) supplied by matching network 16 to coil 12 exclusively in response to the output signal of current transducer 42.

In accordance with the present invention, the values of load capacitor 18 and tune capacitor 20 are simultaneously varied by amounts to invariably obtain a very close impedance match between the output terminals of source 14 and the load it is driving. The relative amounts that the values of capacitors 18 and 20 are varied are determined so matching is invariably approached from the correct direction. In the preferred embodiment, the extent of the impedance match is indicated by maximizing percent delivered power supplied by source 14 to the load it is driving. When percent delivered power is maximized, reflected power is minimized. It is to be understood, however, that other parameters relating the impedance match of source 14 and the load it is driving can be employed; other exemplary preferred parameters that can be maximized to indicate impedance match are ratio of delivered power to forward power and current supplied to coil 12.

In addition, the degree of impedance match can be determined by microprocessor 30 (1) comparing the phase angle between the voltage and current supplied by source 14 to cable 15 and (2) comparing the real impedance seen by source 14 looking into cable 15 and the known real impedance seen looking into the output terminals of source 14. In a matched condition, microprocessor 30 determines that the phase angle is zero and the real impedances are equal. However, it is more difficult to rely on comparisons (1) and (2) than on the other functions because the results of the comparisons must be combined.

Figure 2:
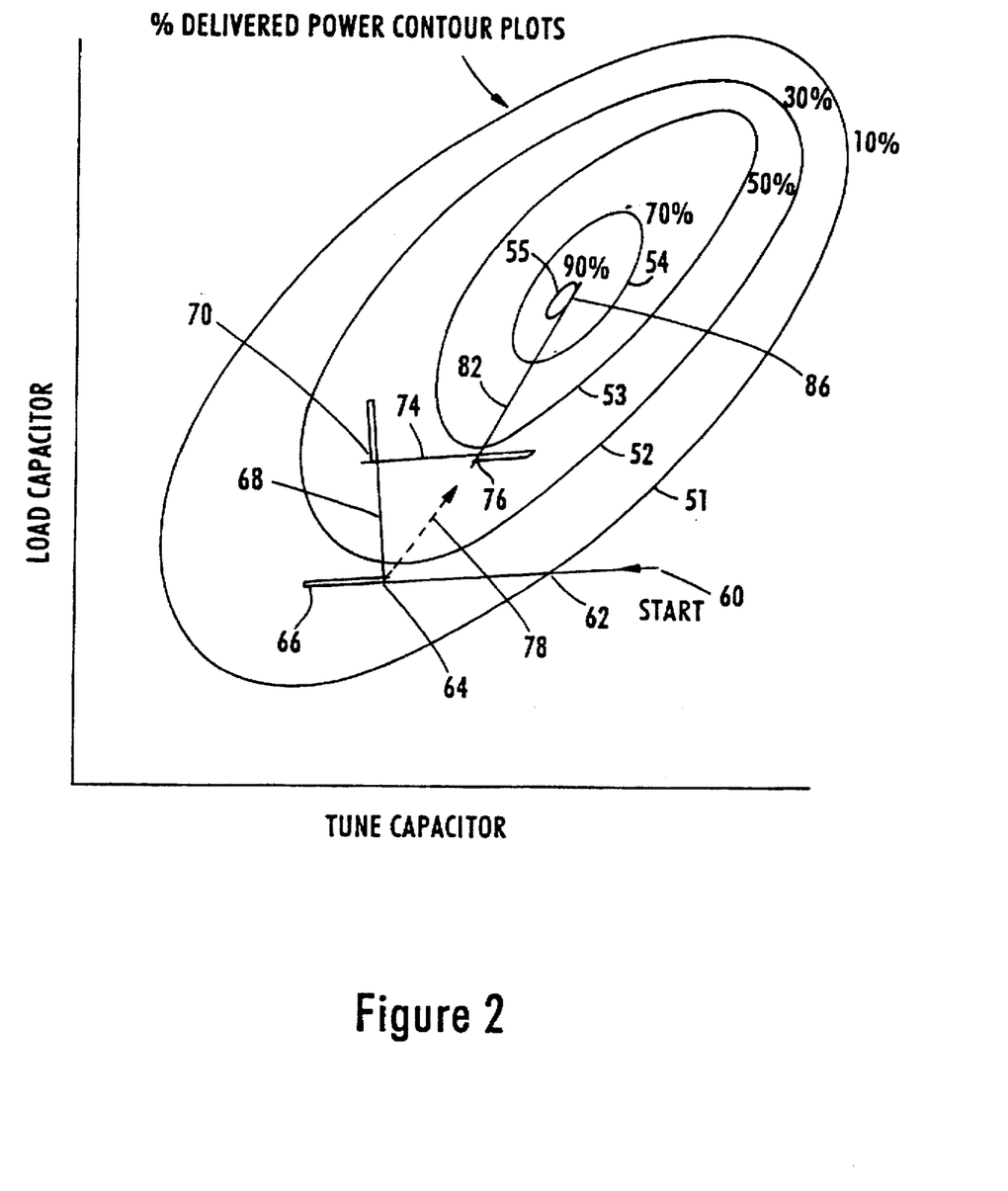
FIG. 2 is a plot indicating how the apparatus of FIG. 1 operates.

FIG. 2 is helpful in describing how microprocessor 30 varies the values of capacitors 18 and 20 to achieve the aforementioned results. FIG. 2 is a plot of the values of tune capacitor 20 (along the X axis direction) and the values of load capacitor 18 (along the Y axis direction) for multiple percent delivered power contours 51–55. Each of contours 51–55 has a somewhat elliptical shape with contours 51, 52, 53, 54 and 55 respectively representing contours for 10%, 30%, 50%, 70% and 90% delivered power. For all values of capacitors 18 and 20 outside 10% contour 51, the percent delivered power is less than 10% and for all values of capacitors 18 and 20 inside 90% contour 55 the value of the percent delivered power exceeds 90%. While only five contours are illustrated in FIG. 2 there is actually an infinite number of such contours that are a function of the values of capacitors 18 and 20. The contours are somewhat dynamic, depending on parameters of the plasma in processor 10.

Initially, microprocessor 30 determines the relative rates of change of capacitors 18 and 20 to calculate a trajectory through the contours of FIG. 2. As the first step of this determination, microprocessor 30 changes the value of tune capacitor 20 while the value of load capacitor 18 is maintained constant until the microprocessor detects a "local" maximum percent delivered power value. Then, during the second step of this determination, microprocessor 30 changes the value of load capacitor 18 while the value of tune capacitor 20 is maintained constant until the microprocessor detects another local maximum percent delivered power value. Then, during the third step, microprocessor 30 changes the value of tune capacitor 20 while the value of load capacitor 18 is maintained constant until the microprocessor detects another local percent delivered power value.

From the values of capacitors 18 and 20 at the ends of the first and third steps, microprocessor 30 determines the slope of a first straight line trajectory on FIG. 2 which will result in approximately maximizing percent delivered power. The slope of the first line indicates the amount by which microprocessor 30 must change one of capacitors 18 or 20 for each unit change in the value of the other capacitor. The values of capacitors 18 and 20 are then simultaneously varied by microprocessor 30 along the first trajectory until microprocessor 30 again detects maximum percent delivered power. Typically, at the end of the first trajectory, maximum percent delivered power has a value in excess of 90%.

To maximize percent delivered power, if maximum percent delivered power along the first straight line trajectory is detected as being less than a predetermined target value, such as 96%, microprocessor 30 simultaneously changes the values of capacitors 18 and 20 so there is a second straight line trajectory at right angles to the first trajectory. The second trajectory begins at the point along the first trajectory which resulted in the local maximized percent delivered power. To this end, microprocessor 30 simultaneously changes the values of capacitors 18 and 20 by a ratio which is opposite from the ratio which resulted in the first straight line trajectory; in other words if the slope of the first trajectory is $$\frac{\Delta y_1}{\Delta x_1},$$

the slope of the second trajectory is $$\frac{\Delta x_1}{\Delta y_1}.$$

The end point of the second trajectory is at the local maximum of percent delivered power.

In the preferred embodiment a further trajectory, if it is necessary, is determined by microprocessor 30 from an intermediate point along the first trajectory to the end point of the second trajectory. The intermediate point along the first trajectory is preferably the local maximum point which was detected the second time tune capacitor 20 was varied while load capacitor 18 was kept constant. The starting point along the further trajectory is at the end of the second trajectory even though a projection of the second trajectory is through the intermediate point of the first trajectory. After microprocessor 30 determines the further trajectory, it controls motors 26 and 28 to simultaneously change the values of capacitors 18 and 20 along the further trajectory until the microprocessor detects a new local maximum percent delivered power. Usually, the new local maximum will exceed the minimum desired value of maximum percent delivered power and the values of capacitors 18 and 20 are stabilized. Microprocessor 30 again varies the values of capacitors 18 and 20 in the manner indicated, when the microprocessor detects that the percent delivered power drops below the target value.

The further trajectory can be alternatively determined by performing some other steps after the end point of the second trajectory has been found. To this end, microprocessor 30 simultaneously changes the values of capacitors 18 and 20 along a third straight line trajectory at right angles to the second straight line trajectory, i.e., parallel to the first straight line trajectory. The third trajectory starts at the end point of the second trajectory and ends at the local maximum of percent delivered power. If microprocessor 30 detects the percent delivered power at the end of the third trajectory as still being less than the predetermined target value, the microprocessor uses the values of capacitors 18 and 20 at the ends of the first and third trajectories to compute a new slope for a new, further trajectory.

Microprocessor 30 then simultaneously varies the values of capacitors 18 and 20 from the values at the end of the third trajectory along the further trajectory until the microprocessor detects a new local maximum. Usually, the new local maximum will exceed the minimum desired value of maximum percent delivered power and the values of capacitors 18 and 20 are stabilized. Microprocessor 30 again varies the values of capacitors 18 and 20 in the manner indicated, when the microprocessor detects that the percent delivered power drops below the target value.

For the specific situation illustrated in FIG. 2, the values of load capacitor 18 and tune capacitor 20 are initially such that the percent delivered power is less than 10%, whereby starting point 60 in the process of simultaneously controlling the values of capacitors 18 and 20 is outside of 10% delivered power contour 51. Initially, microprocessor 30 responds to a command in EPROM 34 to reduce the value of tune capacitor 20 to provide a first straight line trajectory 62 parallel to the X axis. To this end, microprocessor 30 supplies motor 28 with a signal that causes the value of capacitor 20 to be reduced. As the value of capacitor 20 is reduced, microprocessor 30 responds to the output signals of transducers 38 and 40 to calculate percent delivered power. The percent delivered power values calculated by microprocessor 30 are continuously compared with each other in the microprocessor. As a result of the change in the value of capacitor 20, microprocessor 30 calculates local maximum percent delivered power at point 64. However, microprocessor 30 cannot stop capacitor 20 at point 64 and the value of capacitor 20 continues to decrease so the percent delivered power maximum decreases until the value of capacitor 20 has dropped to the value indicated by point 66. Microprocessor 30 responds to the values stored in RAM 36 of local maximum percent delivered power for the different values of capacitor 20 and a signal in EPROM 34 to return capacitor 20 to the value it had at point 64. Then EPROM 34 supplies microprocessor 30 with a signal commanding the microprocessor to drive motor 26 in a direction to increase the value of load capacitor 18, while maintaining motor 28 static. Thereby, the value of load capacitor 18 increases along straight line trajectory 68, while microprocessor 30 repeatedly computes percent delivered power. Thus the program in EPROM 34 initially increases the value of capacitor 18 and initially decreases the value of capacitor 20. After the initial decrease in the value of capacitor 20 and increase in the value of capacitor 18, microprocessor 30 detects whether the percent delivered power has increased or decreased. If microprocessor 30 determines the percent delivered power has increased (as assumed in the example of FIG. 2), the value of the capacitor continues to be changed in the direction initially commanded by the signal in EPROM 34. If, however, microprocessor 30 determines the percent delivered power has decreased, the microprocessor reverses the direction of motor 26 or 28 to reverse the initial direction of change of capacitor 18 or 20. This procedure enables the values of capacitors 18 and 20 always to be changed in the correct direction in the determination of the trajectory.

At point 70, the percent delivered power calculated by microprocessor 30 in response to output signals of transducers 38 and 40 goes through a local maximum. Microprocessor 30 cannot stop capacitor 18 at point 70 and the value of capacitor 18 continues to increase, so the percent delivered power decreases to less than the local maximum value at point 70. Then microprocessor 30 reverses the direction of drive of motor 26, to return the value of capacitor 18 to the value which caused the local maximum at point 70 to be reached.

Then, EPROM 34 and RAM 30 supply microprocessor 30 with a signal which causes DC motor 28 to increase the value of tune capacitor 20, while DC motor 26 maintains load capacitor 18 at a constant value. Thereby, trajectory 74 is traversed. Trajectory 74 is traversed so it goes through local maximum 76 until a decrease in percent delivered power is again detected. Microprocessor 30 then reverses the direction of drive of motor 28 to reduce the value of tune capacitor 20 so that the local maximum at point 76 is again reached.

The values of capacitors 18 and 20 at the end points of the first and third trajectories 62 and 74 are stored in RAM 36 at this time. Microprocessor 30 retrieves these values from RAM 36 and calculates the slope of the straight line trajectory 78 connecting these points together. The slope of straight line trajectory 78 indicates the amount by which load capacitor 18 should change for each unit change in the value of tune capacitor 20. These relative values are stored by microprocessor 30 in RAM 36.

EPROM 34 then commands microprocessor 30 to retrieve the values for the amount by which load capacitor 18 should change for each unit change in the value of tuned capacitor 20. Microprocessor 30 supplies these values to DC motors 26 and 28 in such a manner that the motors simultaneously change the values of load capacitor 18 and tune capacitor 20 along straight line trajectory 82, an aligned extension of trajectory 78. Since trajectories 78 and 82 are aligned, so both include points 64 and 76, point 76 is an intermediate point of the trajectory for the values of capacitors 18 and 20 even though trajectory 78 was never traversed.

Microprocessor 30 continuously computes the values of percent delivered power as trajectory 82 is being traversed until the microprocessor detects a local maximum percent delivered power. In the exemplary situation illustrated in FIG. 2, the percent delivered power increases from a value of slightly less than 50% to in excess of 90% as trajectory 82 is traversed. The maximum value of percent delivered power along trajectory 82 exceeds 90%. As the value of percent delivered power computed by microprocessor 30 increases beyond 90%, the microprocessor responds to a subroutine in EPROM 34 to reduce the speeds of motors 26 and 28 and therefore the absolute rates of change of capacitors 18 and 20, to minimize overshoot. While the absolute rates of change of the values of capacitors 18 and 20 change, the relative rates thereof do not change so trajectory 82 continues.

After trajectory 82 has gone through a maximum value of percent delivered power, microprocessor 30 reverses the direction of motors 26 and 28 to reverse the values of capacitors 18 and 20 until the microprocessor again detects the maximum value of percent delivered power. Microprocessor 30 compares the now detected value of percent delivered power with a signal stored in EPROM 34 indicative of the target value (typically 96%) for percent delivered power. If microprocessor 30 detects that the target value of percent delivered power is reached, it supplies no further signals to motors 26 and 28 and the values of capacitors 18 and 20 are stabilized until maximum delivered power drops below the target value. It is to be understood that the detected, actual value of maximum delivered power can exceed the target value. Microprocessor 30 compares the maximum percent delivered power with the target value for percent delivered power to determine whether or not further changes are necessary in the values of capacitors 18 and 20 to achieve the target value of percent delivered power.

If microprocessor 30 determines that trajectory 82 did not result in a maximum percent delivered power within the target value, the microprocessor determines a new, further trajectory for the values of load capacitor 18 and tune capacitor 20. Typically, the further trajectory increases the maximum percent delivered power from somewhere in the 90% range to at least 96%.

To determine the further trajectory, microprocessor 30 loads the values of load capacitor 18 and tune capacitor 20 which resulted in the maximum delivered power along trajectory 82 into RAM 36, i.e. the values of the capacitors at the end point of trajectory 82 are supplied to the RAM. Microprocessor 30 then responds to these values to compute trajectory 88, FIG. 3, at right angles to trajectory 82. Trajectory 88 intersects maximum delivered power end point 86 on trajectory 82.

Figure 3:
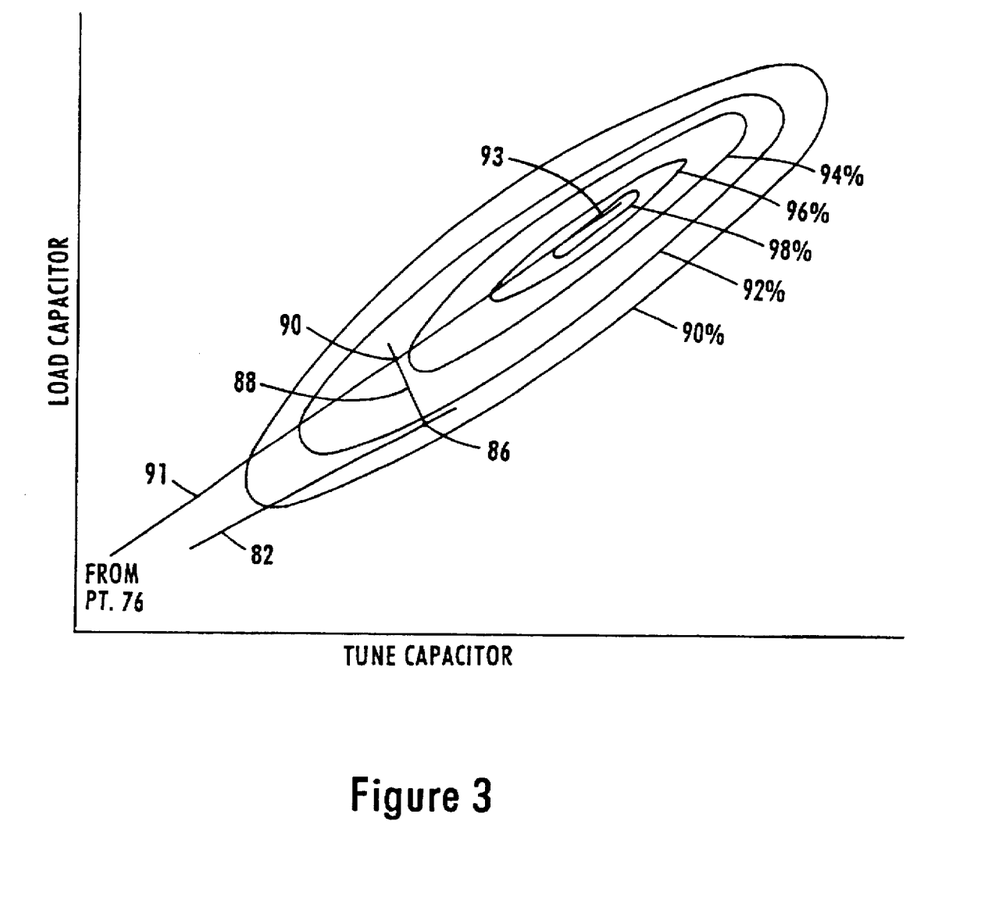
FIG. 3 is a more detailed plot of how the apparatus of FIG. 1 operates to achieve final, maximum percent delivered power.

FIG. 3 is an enlarged diagram of a portion of FIG. 2 wherein the values of tune capacitor 20 and load capacitor 18 are respectively illustrated along the X and Y axes, in combination with percent delivered power contours in excess of 90%. FIG. 3 is useful in describing how microprocessor 30 controls the values of capacitors 18 and 20 to achieve the target percent delivered power or a percent delivered power in excess of the target value.

Trajectory 88, at a right angle to trajectory 82, is determined by reversing the relative rates of change of capacitors 18 and 20 for trajectory 82. Hence, microprocessor 30 supplies signals to motors 26 and 28 so that the relative speeds of the motors and the relative rates of changes of capacitors 18 and 20 along trajectory 88 are exactly opposite from those along trajectory 82. Trajectory 88 is traversed until microprocessor 30 detects the local maximum percent delivered power in response to signals from transducers 38 and 40. Immediately after microprocessor 30 detects local maximum percent delivered power along trajectory 88, it reverses the directions of motors 26 and 28 so that the values of capacitors 18 and 20 are at end point 90 along trajectory 88.

After end point 90 has been reached, microprocessor 30 computes the relative rates of change of capacitors 18 and 20 to produce further trajectory 91. The starting point for trajectory 91 is preferably intermediate point 76 along aligned trajectories 78 and 82, while end point 90 of trajectory 88 is another point along trajectory 91. Hence, microprocessor 30 computes the slope of trajectory 91 from the values of capacitors 18 and 20 at points 76 and 90. It is also to be understood that a different probably somewhat less accurate further trajectory could be produced by microprocessor 30 in response to the values of capacitors 18 and 20 at points 64 and 90.

After microprocessor 30 calculates the relative rates of change for capacitors 18 and 20 along trajectory 91, the microprocessor supplies motors 26 and 28 with signals which cause the values of capacitors 18 and 20 to change along trajectory 91, starting at point 90. The values of capacitors 18 and 20 are varied and trajectory 91 is traversed until the percent delivered power detected by microprocessor 30 goes through a maximum value, at point 93. After point 93 has been reached, microprocessor 30 reverses the directions of motors 26 and 28 so the values of capacitors 18 and 22 return to the values associated with point 93. These capacitor values are supplied by microprocessor 30 to RAM 36. Microprocessor 30 then computes percent delivered power and compares that computed value with the target percent delivered power. If the target percent delivered power is exceeded by the computed percent delivered power, microprocessor 30 supplies no additional signals to capacitors 18 and 20 and the values of the capacitors are stabilized. Alternatively if a higher maximum percent delivered power is desired, or if the local maximum percent delivered power does not reach the threshold, microprocessor 30 is programmed to compute a new straight line trajectory, not shown. The new straight line trajectory is computed by microprocessor 30 basically the same way trajectory 91 was computed, but the starting point is point 90.

Figure 4:
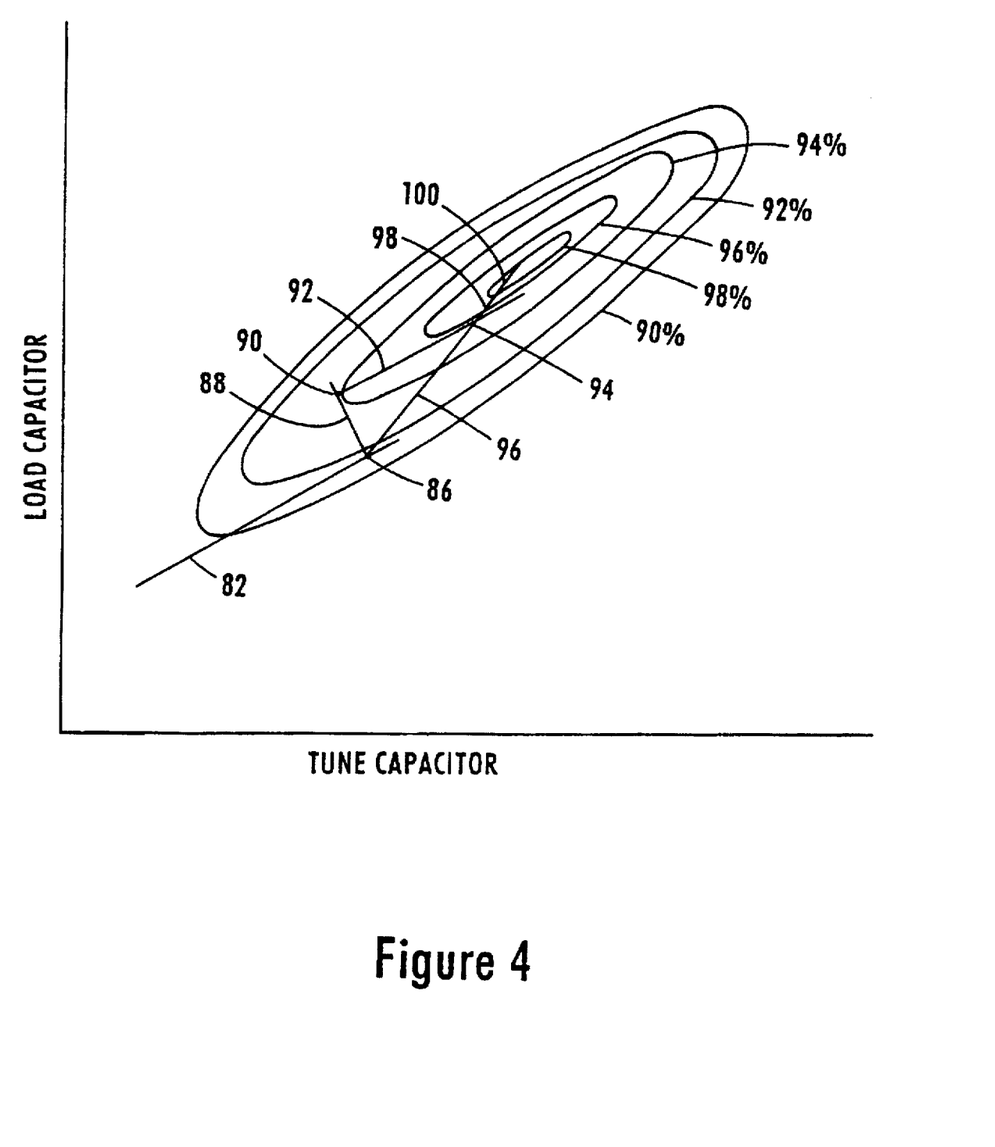
FIG. 4 is a detailed plot of another way the apparatus of FIG. 1 can operate to achieve final, maximum percent delivered power.

Another way of maximizing percent delivered power is illustrated in FIG. 4. In FIG. 4, microprocessor 30 computes trajectory 88 and end point 90 as described supra in connection with FIG. 3. After end point 90 has been reached, microprocessor 30 controls motors 26 and 28 so the values of capacitors 18 and 20 cause trajectory 92 to be traversed. Trajectory 92 intersects maximum delivered power end point 90 at right angles to trajectory 88, hence parallel to trajectory 82. Thus, while trajectory 92 is being traversed, the values of capacitors 18 and 20 are varied at the same relative rates as they were varied along trajectory 82. Microprocessor 30 determines the correct directions of trajectories 88 and 92 from end points 86 and 92 in response to initial directions for them stored in EPROM 34 and by comparing successive values of percent delivered power it computes as the trajectories 86 and 92 are being traversed. The directions the values of capacitors 18 and 20 are changed by microprocessor 30 are reversed if the microprocessor detects that percent delivered power decreases.

Trajectory 92 is traversed until the percent delivered power detected by microprocessor 30 goes through a maximum value, at point 94. After point 94 has been reached, microprocessor 30 reverses the directions of motors 26 and 28 so the values of capacitors 18 and 22 return to the values associated with point 94. These capacitor values are supplied by microprocessor 30 to RAM 36. Microprocessor 30 then computes percent delivered power and compares that computed value with the target percent delivered power. If the target percent delivered power is exceeded by the computed percent delivered power, microprocessor 30 supplies no additional signals to capacitors 18 and 20 and the values of the capacitors are stabilized. Alternatively if a higher maximum percent delivered power is desired, or if the local maximum percent delivered power does not reach the threshold, microprocessor 30 is programmed to compute a new straight line trajectory 96.

To this end, microprocessor 30 then responds to the stored values in RAM 36 indicative of the values of load and tune capacitors 18 and 20 for points 86 and 94 to compute the slope of a further straight line trajectory 96 connecting points 86 and 94 together. From the computation of the slope of trajectory 96, microprocessor 30 determines the relative rates at which motors 26 and 28 should change to vary the values of capacitors 18 and 20 along trajectory 96. Microprocessor 30 then supplies signals to motors 26 and 28 to simultaneously change the values of capacitors 18 and 22 from point 94 along straight trajectory 98 that is an aligned extension of line 96. Microprocessor 30 changes the values of capacitors 18 and 20 so trajectory 98 is traversed. Trajectory 98 is traversed until microprocessor 30 determines that maximum percent delivered power has been reached at point 100 that lies inside the 98% delivered power contour.

While there has been described and illustrated one specific embodiment of the invention, it will be clear that variations in the details of the embodiment specifically illustrated and described may be made without departing from the true spirit and scope of the invention as defined in the appended claims. While the matching network 16 is specifically illustrated as a T, the matching network can be configured as an "L" including a shunt variable load capacitor and a series variable tune capacitor connected to the reactive impedance element that excites the plasma. Such L networks are frequently used with capacitive type impedance plasma excitation reactances and include a fixed inductor connected in series with the excitation reactances. As is known in the art, an "L" type matching network is usually adjusted at a matched condition so it delivers maximum voltage to its load at the frequency of the r.f. source. In contrast, a "T" type matching network is usually adjusted at a matched condition so it operates along the "skirt" of the network, i.e., the T networks do not usually deliver maximum voltage at a matched condition.

What is claimed:

1. A method of supplying an r.f. field to a plasma in a vacuum plasma chamber processing a workpiece, the r.f. field being supplied to the plasma by a reactive impedance element connected via a matching network to an r.f. source, the r.f. field having a frequency and power level sufficient to ignite the gas into the plasma and to maintain the plasma, the matching network including first and second variable reactances that control loading of the source and tuning a load including the reactive impedance element and the plasma to the source, the method comprising (1) determining the amount the first variable reactance is to change for each unit change of the second variable reactance to attain the best match between the impedances seen looking into and out of output terminals of the r.f. source by changing the values of the first and second variable reactances, and (2) then varying the values of the first and second variable reactances based on the determination made in step (1) until the best impedance match between the impedances seen looking into and out of output terminals of the r.f. source is attained.

2. The method of claim 1 wherein the best match between the impedances seen looking into and out of output terminals of the r.f. source is determined as a function of the power coupled between the source and a load including the reactive impedance element and the plasma.

3. The method of claim 2 wherein the function is maximum r.f. current flowing to the reactive impedance element.

4. The method of claim 2 wherein the function is based on maximum power delivered to the load relative to source output power.

5. The method of claim 1 wherein the values of the first and second variable reactances are simultaneously changed during step (2).

6. The method of claim 5 wherein the values of the first and second variable reactances are sequentially changed during step (1) so the first variable reactance is changed while the second variable reactance is not changed and the second variable reactance is changed while the first variable reactance is not changed.

7. The method of claim 5 wherein the values of the first and second variable reactances are simultaneously changed during step (1).

8. The method of claim 1 wherein the values of the first and second variable reactances are sequentially changed during step (1) so the first variable reactance is changed while the second variable reactance is not changed and the second variable reactance is changed while the first variable reactance is not changed.

9. The method of claim 1 wherein the values of the first and second variable reactances are simultaneously changed during step (1).

10. A method of supplying an r.f. field to a plasma in a vacuum plasma chamber processing a workpiece, the r.f. field being supplied to the plasma by a reactive impedance element connected via a matching network to an r.f. source, the r.f. field having a frequency and power level sufficient to ignite the gas into the plasma and to maintain the plasma, the matching network including first and second variable reactances that control loading of the source and tuning a load including the reactive impedance element and the plasma to the source, the method comprising: (1) changing the value of only the first of said variable reactances until the best impedance match between the impedances seen looking into and out of output terminals of the r.f. source is attained; (2) then changing only the value of the second of said variable reactances until the best impedance match between the impedances seen looking into and out of output terminals of the r.f. source is attained; (3) then changing the value of only the first of said variable reactances until the best impedance match between the impedances seen looking into and out of output terminals of the r.f. source is attained; (4) from indications of the values of the first and second variable reactances at the completion of steps (1) and (3), determining the amount the first variable reactance is to change for each unit change in the value of the second variable reactance; and (5) then varying the values of the first and second variable reactances based on the determination of step (4) and until the best possible impedance match between the impedances seen looking into and out of output terminals of the r.f. source is attained.

11. The method of claim 10 wherein the variations in values of step (5) result in a first straight line trajectory in a plot of the values of the first and second variable reactances, the method further including:

(a) determining if the best possible impedance match at the completion of step (5) meets a minimum criterion;

(b) in response to the determination at the end of step (5) meeting the minimum criterion, maintaining the values of the first and second variable reactances constant;

(c) in response to the determination at the end of step (5) not meeting the minimum criterion, changing the values of the first and second variable reactances so there is a second straight line trajectory at a right angle to the first trajectory until the best possible match between the impedances seen looking into and out of output terminals of the r.f. source is attained; and (d) then simultaneously changing the values of the first and second variable reactances along a further straight line trajectory including a point on the first trajectory and a further point determined by the point on the second trajectory where the best possible match between the impedances seen looking into and out of output terminals of the r.f. source is attained.

12. The method of claim 11 wherein the point on the first and further trajectories is an intermediate point along the first trajectory.

13. The method of claim 12 wherein the further point on the further trajectory is the point on the second trajectory where the best possible match between the impedances seen looking into and out of output terminals of the r.f. source is attained.

14. The method of claim 11 wherein the further point on the further trajectory is the point on the second trajectory where the best possible match between the impedances seen looking into and out of output terminals of the r.f. source is attained.

15. The method of claim 11 wherein the best impedance match between the impedance seen looking into and out of output terminals of the r.f. source is determined as a function of the power coupled between the source and a load including the reactive impedance element and the plasma.

16. The method of claim 15 wherein the function is maximum r.f. current flowing to the reactive impedance element.

17. The method of claim 15 wherein the function is based on maximum power delivered to the load relative to source output power.

18. The method of claim 11 wherein the values of the first and second variable reactances are simultaneously changed during step (5).

19. The method of claim 10 wherein the values of the first and other variable reactances are simultaneously changed during step (5).

20. The method of claim 10 wherein the best possible match between the impedances seen looking into and out of output terminals of the r.f. source is determined as a function of the power coupled between the source and a load including the reactive impedance element and the plasma.

21. The method of claim 20 wherein the function is maximum r.f. current flowing to the reactive impedance element.

22. The method of claim 20 wherein the function is based on maximum power delivered to the load relative to source output power.

23. Apparatus for supplying an r.f. field to a plasma in a vacuum plasma chamber for processing a workpiece, comprising a reactive impedance element for supplying the r.f. field to the plasma, the reactive impedance element being connected via a matching network to an r.f. source, the r.f. field having a frequency and power level sufficient to ignite the gas into the plasma and to maintain the plasma, the matching network including first and second variable reactances for controlling loading of the source and tuning a load including the reactive impedance element and the plasma to the source, a controller for (1) determining the amount the first variable reactance is to change for each unit change of the second variable reactance to attain the best match between the impedances seen looking into and out of output terminals of the r.f. source by changing the values of the first and second variable reactances, and (2) then varying the values of the first and second variable reactances based on the determination of (1) until the best impedance match between the impedances seen looking into and out of output terminals of the r.f. source is attained.

24. The apparatus of claim 23 wherein the best match between the impedances seen looking into and out of output terminals of the r.f. source is determined as a function of the power coupled between the source and a load including the reactive impedance element and the plasma.

25. The apparatus of claim 24 wherein the function is maximum r.f. current flowing to the reactive impedance element.

26. The apparatus of claim 24 wherein the function is based on maximum power delivered to the load relative to source output power.

27. The apparatus of claim 23 wherein the values of the first and second variable reactances are simultaneously changed during (2).

28. The apparatus of claim 27 wherein the values of the first and second variable reactances are sequentially changed during (1) so the first variable reactance is changed while the second variable reactance is not changed and the second variable reactance is changed while the first variable reactance is not changed.

29. The apparatus of claim 27 wherein the values of the first and second variable reactances are simultaneously changed during (1).

30. The apparatus of claim 23 wherein the values of the first and second variable reactances are sequentially changed during (1) so the first variable reactance is changed while the second variable reactance is not changed and the second variable reactance is changed while the first variable reactance is not changed.

31. The apparatus of claim 23 wherein the values of the first and second variable reactances are simultaneously changed during (1).

32. A memory for use with a computer for controlling an r.f. field supplied to a plasma in a vacuum plasma chamber for processing a workpiece, the r.f. field being supplied to the plasma by a reactive impedance element connected via a matching network to an r.f. source, the r.f. field having a frequency and power level sufficient to ignite the gas into the plasma and to maintain the plasma, the matching network including first and second variable reactances that control loading of the source and resonating a load including the reactive impedance element and the plasma to the source, the memory storing signals to cause the computer to: (1) determine the amount the first of the variable reactances is to change for each unit change of the second of the variable reactances to attain the best match between the impedances seen looking into and out of output terminals of the r.f. source by commanding the computer to change the values of the first and second variable reactances; and (2) then vary the values of the first and second variable reactances based on the determination (1) until the computer determines the best impedance match between the impedances seen looking into and out of output terminals of the r.f. source is attained.

33. A method of supplying an r.f. field to a plasma in a vacuum plasma chamber processing a workpiece, the r.f. field being supplied to the plasma by a reactive impedance element connected via a matching network to an r.f. source, the r.f. field having a frequency and power level sufficient to ignite the gas into the plasma and to maintain the plasma, the matching network including first and second variable reactances that control loading of the source and tuning a load including the reactive impedance element and the plasma to the source, the method comprising (1) determining the amount the first variable reactance is to change for each unit change of the second variable reactance by changing the values of the first and second variable reactances until an initial best match is attained between the impedances seen looking into and out of output terminals of the r.f. source, and (2) then varying the values of the first and second variable reactances based on the determination made in step (1) until the best impedance match between the impedances seen looking into and out of output terminals of the r.f. source is attained.

34. Apparatus for supplying an r.f. field to a plasma in a vacuum plasma chamber for processing a workpiece, comprising a reactive impedance element for supplying the r.f. field to the plasma, the reactive impedance element being connected via a matching network to an r.f. source, the r.f. field having a frequency and power level sufficient to ignite the gas into the plasma and to maintain the plasma, the matching network including first and second variable reactances for controlling loading of the source and tuning a load including the reactive impedance element and the plasma to the source, a controller for (1) determining the amount the first variable reactance is to change for each unit change of the second variable reactance by changing the values of the first and second variable reactances until the best initial match between the impedances as seen looking into and out of output terminals of the r.f. source is attained, and (2) then varying the values of the first and second variable reactances based on the determination of (1) until the best impedance match between the impedances seen looking into and out of output terminals of the r.f. source is attained.

35. A memory for use with a computer for controlling an r.f. field supplied to a plasma in a vacuum plasma chamber for processing a workpiece, the r.f. field being supplied to the plasma by a reactive impedance element connected via a matching network to an r.f. source, the r.f. field having a frequency and power level sufficient to ignite the gas into the plasma and to maintain the plasma, the matching network including first and second variable reactances that control loading of the source and resonating a load including the reactive impedance element and the plasma to the source, the memory storing signals to cause the computer to: (1) determine the amount the first of the variable reactances is to change for each unit change of the second of the variable reactances by commanding the computer to change the values of the first and second variable reactances until the best initial match between the impedances seen looking into and out of output terminals of the r.f. source is attained; and (2) then vary the values of the first and second variable reactances based on the determination (1) until the computer determines the best impedance match between the impedances seen looking into and out of output terminals of the r.f. source is attained.

* * * * *